US009711720B2

(12) United States Patent
Chang et al.

(10) Patent No.: US 9,711,720 B2
(45) Date of Patent: Jul. 18, 2017

(54) RESISTIVE RANDOM ACCESS MEMORY HAVING STABLE FORMING VOLTAGE

(71) Applicant: NATIONAL SUN YAT-SEN UNIVERSITY, Kaohsiung (TW)

(72) Inventors: Ting-Chang Chang, Kaohsiung (TW);
Kuan-Chang Chang, Kaohsiung (TW);
Tsung-Ming Tsai, Kaohsiung (TW);
Tian-Jian Chu, Kaohsiung (TW);
Chih-Hung Pan, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 14/734,809

(22) Filed: Jun. 9, 2015

(65) Prior Publication Data

US 2016/0240777 A1 Aug. 18, 2016

(30) Foreign Application Priority Data

Feb. 16, 2015 (TW) .............................. 104105348 A (51) Int. Cl.
*H01L 45/00* (2006.01)

(52) U.S. Cl.
CPC .......... *H01L 45/1253* (2013.01); *H01L 45/08* (2013.01); *H01L 45/1233* (2013.01); *H01L 45/145* (2013.01); *H01L 45/146* (2013.01)

(58) Field of Classification Search
CPC . H01L 45/1253; H01L 45/08; H01L 45/1233; H01L 45/146
See application file for complete search history.

(56) References Cited

U.S. PATENT DOCUMENTS 9,231,203 B1 * 1/2016 Tendulkar ............. H01L 45/145
2012/0305880 A1 * 12/2012 Zhang ................ G11C 13/0007
257/4

(Continued)

FOREIGN PATENT DOCUMENTS

TW 201440273 A 10/2014

OTHER PUBLICATIONS

Kuan-Chang Chang et al., "Characteristics and Mechanisms of Silicon-Oxide-Based Resistance Random Access Memory", IEEE Electronics Device Letters, vol. 34, No. 3, Mar. 2013, pp. 399-401.

*Primary Examiner* — Minh-Loan Tran
*Assistant Examiner* — Farid Khan
(74) *Attorney, Agent, or Firm* — Muncy, Geissler, Olds & Lowe, P.C.

(57) ABSTRACT

A resistive random access memory including a first electrode, a separating medium, a resistance changing layer and a second electrode is disclosed. The first electrode has a mounting face. The separating medium is arranged on the first electrode and forms a through hole. A part of the first electrode is not covered by the separating medium. The separating medium has a first dielectric. The resistance changing layer extends along the part of the first electrode as well as along an inner face and the second face of the separating medium. The resistance changing layer has a second dielectric having a dielectric constant larger than a dielectric constant of the first dielectric by 2 or less. The second electrode is arranged on the resistance changing layer. In this arrangement, the problem of unstable forming voltage of the conventional resistive random access memory can be solved.

5 Claims, 5 Drawing Sheets (56) References Cited

U.S. PATENT DOCUMENTS

| | | | |
|---|---|---|---|
| 2013/0256623 A1* | 10/2013 | Kim | H01L 45/1233 257/4 |
| 2013/0286714 A1* | 10/2013 | Takagi | G11C 13/0004 365/148 |
| 2014/0166966 A1* | 6/2014 | Nishioka | H01L 45/08 257/4 |
| 2014/0284536 A1* | 9/2014 | Arayashiki | H01L 45/085 257/2 |
| 2015/0021539 A1* | 1/2015 | Cai | H01L 45/04 257/4 |
| 2015/0093876 A1* | 4/2015 | Butcher | H01L 45/08 438/382 |
| 2015/0188039 A1* | 7/2015 | Wang | H01L 45/12 257/4 |
| 2015/0255513 A1* | 9/2015 | Nakakubo | H01L 27/2481 365/148 |
| 2015/0263279 A1* | 9/2015 | Hayakawa | H01L 45/1253 257/4 |

* cited by examiner

FIG. 8

RESISTIVE RANDOM ACCESS MEMORY HAVING STABLE FORMING VOLTAGE

BACKGROUND OF THE INVENTION

1. Field of the Invention

The present invention generally relates to a resistive random access memory and, more particularly, to a resistive random access memory having different dielectrics.

2. Description of the Related Art

Memories have been widely used in various electronic products. Due to the increasing need of data storage, the demands of the capacities and performances of the memories become higher and higher. Among various memory elements, resistive random access memories (RRAMs) have an extremely low operating voltage, an extremely high read/write speed, and high miniaturization of the element size and, thus, may replace the conventional flash memories and dynamic random access memories (DRAMs) as the main stream of memory elements of the next generation.

Figure 1:
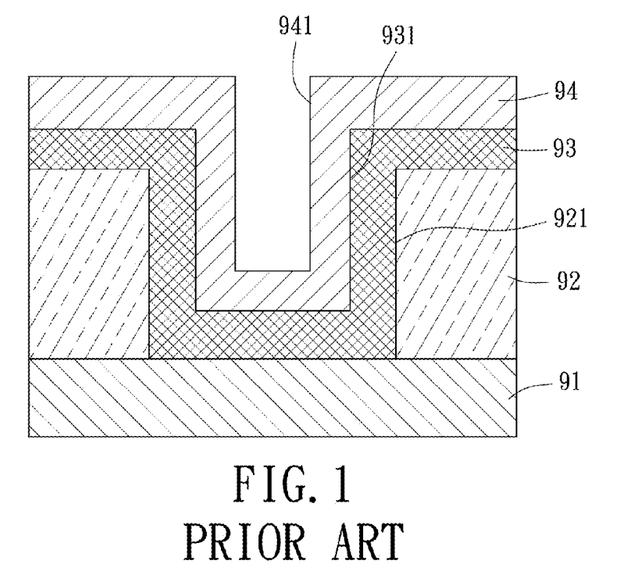
FIG. 1 is a cross sectional view of a conventional resistive random access memory.

FIG. 1 shows the configuration of a conventional resistive random access memory. The conventional resistive random access memory includes a lower electrode 91 (such as platinum, Pt), a first medium 92 (with the K value of 3.9, for example), a second medium 93 (with the K value of 25, for example), and an upper electrode 94 (such as Pt). The first medium 92 is arranged on the lower electrode 91 and forms a through hole 921. The second medium 93 is partially arranged in the through hole 921. In other words, a part of the second medium 93 is arranged on the lower electrode 91 (inside the through hole 921), and another part of the second medium 93 is arranged on the first medium 92 (outside the through hole 921). The second medium 93 includes an inner periphery forming a concave portion 931. The upper electrode 94 extends from the inner periphery of the second medium 93 and defines a hole 941. In this arrangement, the first medium 92 usually has a dielectric constant (K value) much smaller than that of the second medium 93. Thus, the second medium 93 can be switched between a low resistance state (LRS) and a high resistance state (HRS). Such a resistive random access memory may be seen in an academic paper entitled "Characteristics and Mechanism of Silicon-Oxide-Based Resistance Random Access Memory" as published in IEEE ELECTRON DEVICE LETTERS, VOL. 34, No 3 on March 2013.

Figure 2:
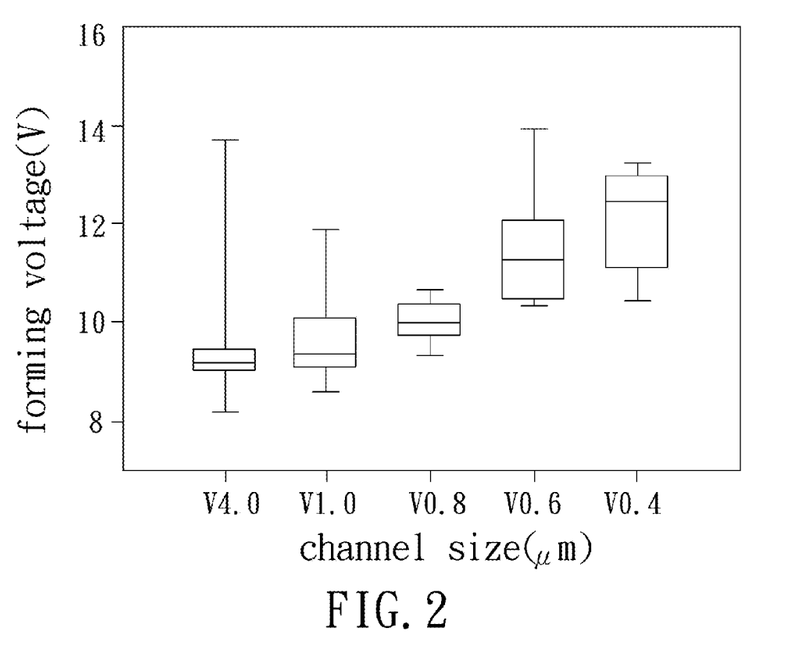
FIG. 2 shows the relation between the forming voltage and the size of the through hole of the conventional resistive random access memory.

Nowadays, the size of the memory must be reduced due to the miniaturization of the modern electronic devices. However, reduction in volume of the memory results in the reduced size of the through hole 921. In this regard, assume the size of the through hole 921 is reduced from 4.0 μm to 0.4 μm as illustrated in FIG. 2, the forming voltage of the memory will increase from 9 to 12 volts. Namely, the forming voltage of the memory increases as the volume of the memory reduces, leading to an unstable forming voltage. In this regard, when the memory is integrated into an integrated circuit (IC), adverse effects such as high power consumption may occur if the forming voltage is too high.

In light of this, it is necessary to improve the conventional resistive random access memory.

SUMMARY OF THE INVENTION

It is therefore the objective of this invention to provide a resistive random access memory that has a stable forming voltage.

In an embodiment, a resistive random access memory including a first electrode, a separating medium, a resistance changing layer and a second electrode is disclosed. The first electrode has a mounting face. The separating medium includes a first face in contact with the mounting face of the first electrode, a second face opposite to the first face, and an inner face extending between the first and second faces. The separating medium forms a through hole extending from the first face to the second face. A part of the mounting face of the first electrode is not covered by the separating medium. The separating medium has a first dielectric. The resistance changing layer extends along the part of the mounting face of the first electrode as well as the inner face and the second face of the separating medium. The resistance changing layer has a second dielectric having a dielectric constant smaller than a dielectric constant of the first dielectric. The second electrode is arranged on the resistance changing layer.

In a form shown, the separating medium further includes a third dielectric having a dielectric constant different from the dielectric constant of the first dielectric. The first and third dielectrics have different distribution regions, and both the first and third dielectrics adjoin the resistance changing layer.

In the form shown, the first dielectric is adjacent to the first electrode than the third dielectric is.

In the form shown, the resistance changing layer forms a recess portion located in the through hole.

In the form shown, the second electrode extends from an interior to an exterior of the recess portion and forms a hole, and wherein the hole is located in the interior of the recess portion.

In the form shown, the interior of the recess portion is completely filled by the second electrode. The second electrode forms a protruding portion, and the protruding portion is located outside of the recess portion.

In the form shown, the second dielectric of the resistance changing layer is a composition of silicon dioxide and hafnium oxide, and the hafnium oxide has a mole ratio of 1-10% in the composition.

In the form shown, the first dielectric of the separating medium is silicon dioxide.

In the above arrangement, since the dielectric constant of the second dielectric of the resistance changing layer is smaller than the dielectric constant of the first dielectric of the separating medium, or is larger than the dielectric constant of the first dielectric of the separating medium by 2 or less, a stable forming voltage can be provided. In addition, the separating medium may further include a third dielectric for easy adjustment of the dielectric constant. The second electrode may protrude from the top surface of the resistance changing layer as a protruding portion, thereby achieving simplification of the production procedure and cost reduction. Advantageously, as compared with the conventional memory where the forming voltage increases as the channel size reduces, the memory of the invention is able to avoid the adverse effects that may be caused by the memory when the memory is integrated into an integrated circuit.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

Figure 3:
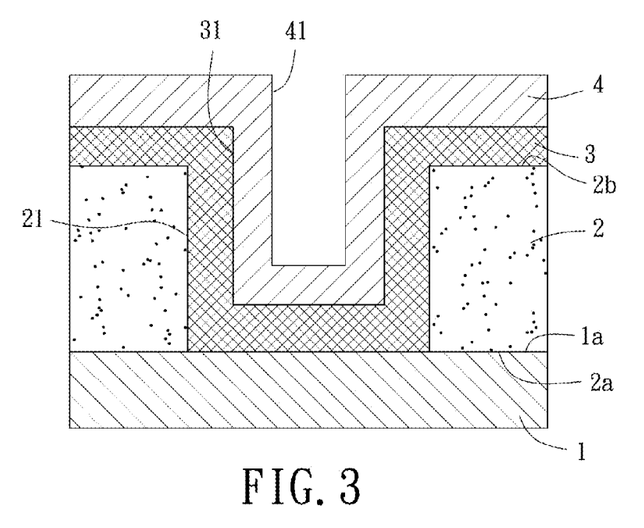
FIG. 3 is a cross sectional view of a resistive random access memory according to a first embodiment of the invention.

FIG. 3 shows a cross sectional view of a resistive random access memory according to a first embodiment of the invention. The resistive random access memory may include a first electrode 1, a separating medium 2, a resistance changing layer 3 and a second electrode 4. The separating medium 2 is arranged on the first electrode 1. The separating medium 2 includes a first face 2a, a second face 2b opposite to the first face 2a, and an inner face extending between the first face 2a and the second face 2b. The separating medium 2 further includes a through hole 21 such that a part of the first electrode 1 is not covered by the separating medium 2. The separating medium 2 includes a first dielectric. The resistance changing layer 3 extends inwards and upwards from the inner face and the second face 2b of the separating medium 2, respectively. The resistance changing layer 3 includes a second dielectric. The second dielectric has a dielectric constant K2 smaller than a dielectric constant K1 of the first dielectric. The second electrode 4 is arranged on the resistance changing layer 3.

The first electrode 1 may be made of a conducting material such as titanium nitride Tin or platinum. The first electrode 1 includes a mounting face 1a. The separating medium 2 may consist of the first dielectric, such as silicon dioxide ($SiO_2$) with a dielectric constant of 3.9. The first face 2a of the separating medium 2 is in contact with the mounting face 1a of the first electrode 1. Since the through hole 21 extends from the first face 2a to the second face 2b, a part of the mounting face 1a of the first electrode 1 is not covered by the separating medium 2. The resistance changing layer 3 may consist of the second dielectric, such as the composition of hafnium oxide ($HfO_2$) and silicon dioxide. $HfO_2$ has a mole ratio of 1-10% in the composition so that the composition has a dielectric constant of 3.9-5.9. In addition, the difference between the first and second dielectric constants K1 and K2 is 0 to 2 ($0<K2-K1\leq 2$) in order for the electric field to be concentrated in the resistance changing layer 3. The resistance changing layer 3 is arranged on the mounting face 1a and the inner face and the second face 2b of the separating medium 2. The resistance changing layer 3 may form a recess portion 31 (by etching process, for example). The recess portion 31 is located in the through hole 21. The second electrode 4 may be made of conducting material, such as indium tin oxide (ITO) or platinum, and may extend from the interior to the exterior of the recess portion 31. The second electrode 4 further forms a hole 41 located in the recess portion 31 of the resistance changing layer 3. The shapes of the through hole 21, the recess portion 31 and the hole 41 can be changed as desired.

Figure 4:
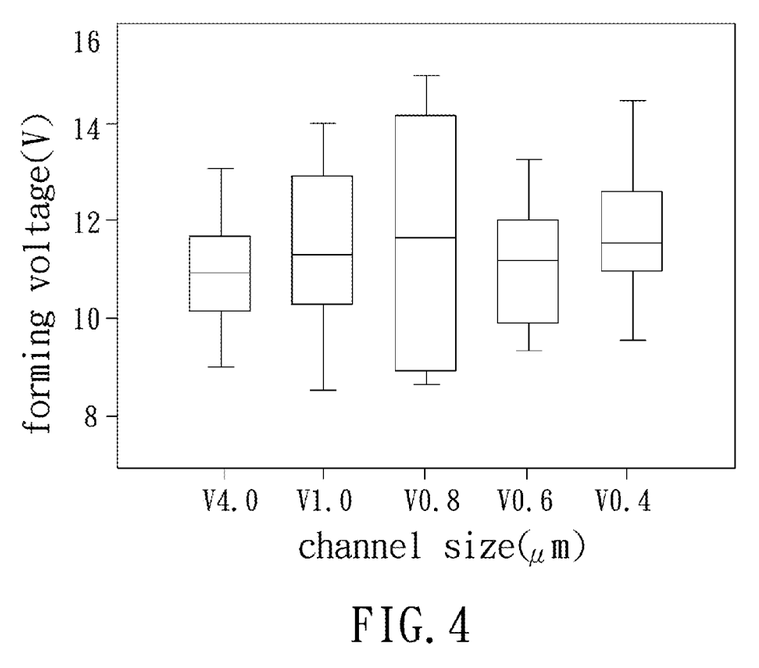
FIG. 4 shows the relation between the forming voltage and the size of the through hole of the resistive random access memory according to the first embodiment of the invention.

FIG. 4 shows the relation between the forming voltage and the size of the through hole. It is observed that when the size of the through hole is reduced from 4.0 μm to 0.4 μm, the forming voltage of the memory varies in a small range (with the average value of 10 to 11V). Thus, the magnitude of the forming voltage is stable. In the following paragraphs, computer imaging technology is used to simulate and compare the electric field distributions between the conventional memory and the memory of the first embodiment of the invention, with both memories having a supply voltage of 15V.

Figure 5A:
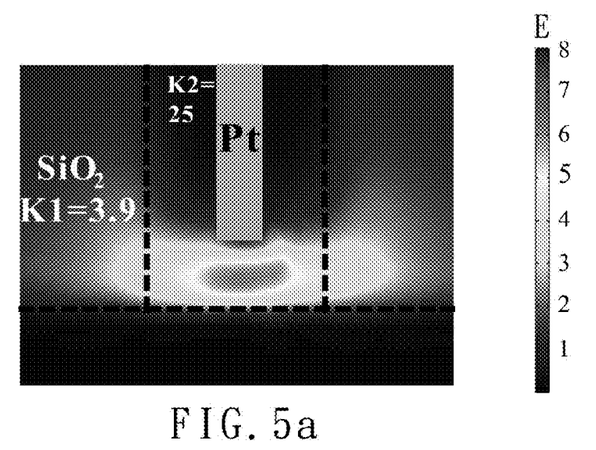
FIG. 5a shows an electric field distribution diagram of the conventional resistive random access memory wherein the dielectric constant of the second dielectric is much larger than that of the first dielectric.

FIG. 5a shows the electric field distribution diagram of the conventional memory where the dielectric constant of the second dielectric is much larger than that of the first dielectric. The dotted lines represent the interface between the first medium 92 and the second medium 93. The area between the dotted lines represents the region where the second medium 93 is, and the areas on two sides represent the region where the first medium 92 is. As the case of the conventional memory, it can be observed from the figure that when the dielectric constant of the second dielectric (K2=25) is larger than that of the first dielectric (K1=3.9), the electric field of the conventional memory is distributed along the first medium and the second medium, and the majority of the electric field is not concentrated in the area of the second medium 93. The scattering of the electric field becomes more severe when the volume of the memory is small. Although the problem can be overcome by supplying the memory with a larger voltage to cause breakdown of the memory and to change the resistance of said memory, the forming voltage of the memory becomes unstable.

Figure 5B:
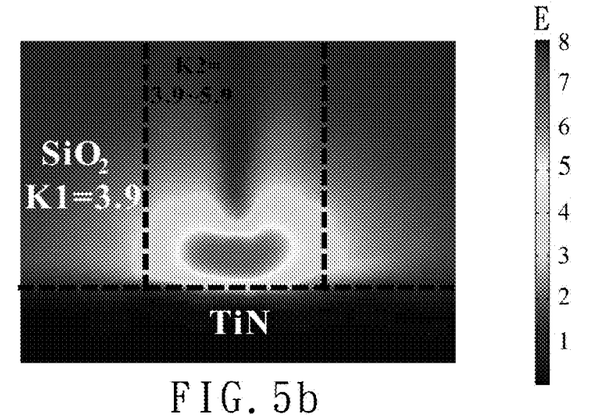
FIG. 5b shows an electric field distribution diagram of the resistive random access memory of the first embodiment of the invention wherein the dielectric constant of the second dielectric is larger than that of the first dielectric by 2 or less.

FIG. 5b shows the electric field distribution diagram of the memory according to the first embodiment of the invention where the dielectric constant of the second dielectric is larger than that of the first dielectric by 2 or less. The dotted lines represent the interface between the separating medium 2 and the resistance changing layer 3. The area between the dotted lines represents the region where the resistance changing layer 3 is, and the areas on two sides represent the region where the separating medium 2 is. It can be observed from the figure that when the dielectric constant of the second dielectric is 3.9 to 5.9 (K2=3.9 to 5.9) and the dielectric constant of the first dielectric is 3.9 (K1=3.9), a great deal of the electric field may be concentrated in the area of resistance changing layer 3 while a much less amount of the electric field is distributed along the separating medium 2 as compared with the conventional memory shown in FIG. 5a. Advantageously, the forming voltage of the memory is stable.

Figure 5C:
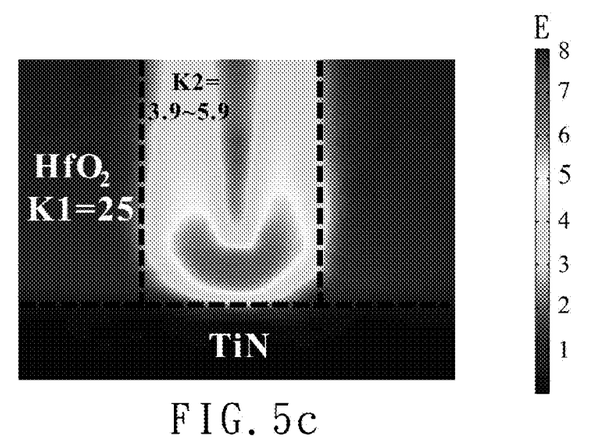
FIG. 5c shows an electric field distribution diagram of the resistive random access memory of the first embodiment of the invention wherein the dielectric constant of the second dielectric is smaller than that of the first dielectric.

FIG. 5c shows the electric field distribution diagram of the memory according to the first embodiment of the invention where the dielectric constant of the second dielectric is smaller than that of the first dielectric. The meaning of the dotted lines is similar to that in FIG. 5b. It can be observed from the figure that when the dielectric constant of the first dielectric is 25 (K1=25) and the dielectric constant of the second dielectric is 3.9 to 5.9 (K2=3.9 to 5.9), the entire electric field is concentrated in the area of the resistance changing layer 3 only. Advantageously, the forming voltage of the memory is stable.

Therefore, when the memory of the first embodiment of the invention is in use, an external electric field may be applied between the first electrode 1 and the second electrode 4 to drive the oxygen ions in the resistance changing layer 3. Based on this, the resistance changing layer 3 may be switched between the high resistance state (HRS) and the low resistance state (LRS). It is noted that since the dielectric constant K2 of the second dielectric of the resistance changing layer 3 is larger than the dielectric constant K1 of the first dielectric of the separating medium 2 by 2 or less (or even K2 is smaller than K1), the electric field will concentrate in the resistance changing layer 3 when the external electric field is applied to the resistance changing layer 3. As such, the electric field is not directed to the separating medium 2, and the required breakdown voltage of the memory does not change, thereby improving the stability of the forming voltage of said memory.

Based on this, when the size of the memory according to the first embodiment of the invention reduces, the forming voltage does not become higher. Hence, stability of the forming voltage is improved. As compared with the conventional memory where the forming voltage increases as the size of the through hole reduces, the memory according to the first embodiment of the invention is able to avoid the adverse effects caused by the memory when the memory is integrated into an integrated circuit (IC).

Figure 6:
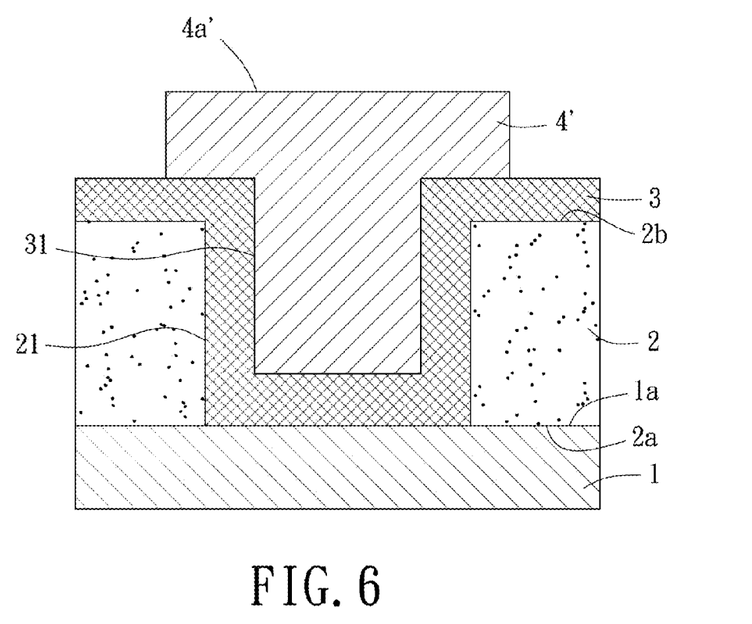
FIG. 6 is a cross sectional view of a resistive random access memory according to a second embodiment of the invention.

FIG. 6 is a cross sectional view of a memory according to a second embodiment of the invention. In this embodiment, the memory includes the first electrode 1, the separating medium 2, the resistance changing layer 3 and a second electrode 4'. The second electrode 4' is made of substantially the same material as the second electrode 4 of the first embodiment. The second electrode 4' differs from the second electrode 4 of the first embodiment in that the second electrode 4' fills the entire recess portion 31 of the resistance changing layer 3 and protrudes from the top surface of the resistance changing layer 3 as a protruding portion 4a'. In this arrangement, the protruding portion 4a' is located outside of the recess portion 31.

In this structure, the second electrode 4' can be applied with an external electric field without requiring the etching process to form any hole. Also, the second electrode 4' does not have to cover a majority of the top surface of the resistance changing layer 3, thus simplifying the production procedure and reducing the cost of the memory. Furthermore, since the dielectric constant K2 of the second dielectric of the resistance changing layer 3 is larger than the dielectric constant K1 of the first dielectric of the separating medium 2 by 2 or less (or even K2 is smaller than K1), a stable forming voltage is provided when the size of the memory reduces. Advantageously, when the memory is integrated into an integrated circuit (IC), adverse effects can be avoided.

Figure 7:
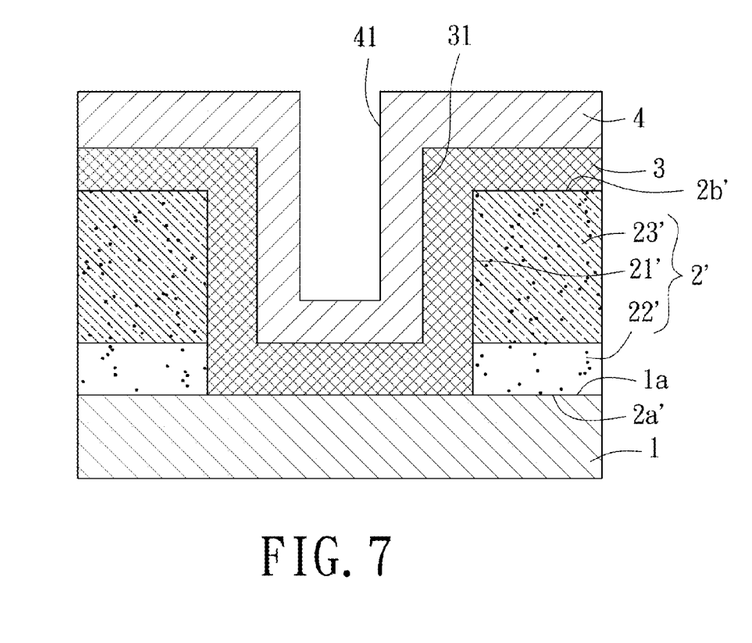
FIG. 7 is a cross sectional view of a resistive random access memory according to a third embodiment of the invention.

FIG. 7 is a cross sectional view of a memory according to a third embodiment of the invention. In this embodiment, the memory includes the first electrode 1, a separating medium 2', the resistance changing layer 3 and the second electrode 4. The separating medium 2' may form a through hole 21' when a part of the mounting face 1a of the first electrode 1 is not covered by the separating medium 2'. The separating medium 2' includes a first face 2a' in contact with the mounting face 1a of the first electrode 1, as well as a second face 2b' opposite to the first face 2a. Since the through hole 21 extends from the first face 2a' to the second face 2b', a part of the mounting face 1a of the first electrode 1 is not covered by the separating medium 2'.

The separating medium 2' in this embodiment differs from the separating medium 2 in the first embodiment in that the separating medium 2' may further include a third dielectric in addition to the first dielectric. The third dielectric may have a dielectric constant K3 different from the dielectric constant K1 of the first dielectric. The third dielectric may be in the form of any insulating layer (such as $SiO_2$, $HfO_2$, or the combination of $SiO_2$ and $HfO_2$ with any ratio). Alternatively, the third dielectric may be the same as the first dielectric. When the third dielectric is the same as the first dielectric, a certain relation between K1 and K2 must be maintained. Moreover, the first dielectric may be located in a region 22' different from the region 23' of the third dielectric. For example, the regions 22' and 23' of the first and third dielectrics may adjoin each other while adjoining the resistance changing layer 3. The region 22' of the first dielectric may be adjacent to the first electrode 1, and the first dielectric may have the same thickness as that of the resistance changing layer 3.

Thus, the dielectric constant of the separating medium 2' may be adjusted based on the use of different dielectrics as well as different distributions of the dielectrics. In this manner, the dielectric constant of the separating medium 2' is controlled in a manner where the dielectric constant K2 of the second dielectric of the resistance changing layer 3 is larger than the dielectric constant K1 of the first dielectric of the separating medium 2 by 2 or less, or is smaller than the dielectric constant of the separating medium 2'. As such, easy adjustment of the dielectric constant is provided. In addition, since the dielectric constant K2 of the second dielectric of the resistance changing layer 3 is smaller than the dielectric constant K1 of the first dielectric of the separating medium 2', a stable forming voltage is provided. Advantageously, adverse effects that may be caused by the memory when the memory is integrated into an integrated circuit (IC) can be avoided.

Figure 8:
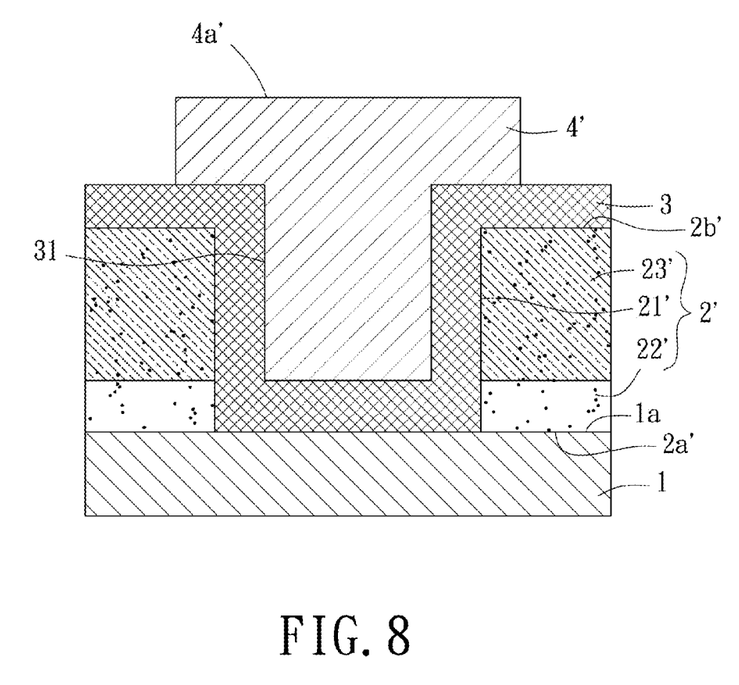
FIG. 8 is a cross sectional view of a resistive random access memory according to a fourth embodiment of the invention.

FIG. 8 is a cross sectional view of a memory according to a fourth embodiment of the invention. The memory in the embodiment is derived from the combination of the memories of the previous first, second and third embodiments. In this embodiment, the memory includes the first electrode 1, the separating medium 2', the resistance changing layer 3 and the second electrode 4'. The separating medium 2' may form a through hole 21' extending from the first face 2a' to the second face 2b', and a part of the first electrode 1 is not covered by the separating medium 2'. The separating medium 2' may include first and third dielectrics having different dielectric constants. The region 22' of the first dielectric is different from the region 23' of the third dielectric. The region 22' of the first dielectric is adjacent to the first electrode 1. The regions 22' and 23' of the first and second dielectrics adjoin the resistance changing layer 3, and the region 22' of the first dielectric is adjacent to the first electrode 1. The region 22' of the first dielectric may have the same thickness as the resistance changing layer 3. The second electrode 4' may protrude from the surface of the resistance changing layer 3 as a protruding portion 41'. The protruding portion 41' is located outside of the recess portion 31 of the resistance changing layer 3. However, this is not taken as a limited sense.

Based on the above structure, the memory according to the fourth embodiment of the invention may achieve the above advantages such as simplification of production procedure, cost reduction and easy adjustment of dielectrics. Similar to the previous embodiments, the memory according to the fourth embodiment of the invention is able to provide a stable forming voltage when the volume of the memory reduces. Advantageously, adverse effects that may be caused by the memory when the memory is integrated into an integrated circuit (IC) can be avoided.

To sum up, the memory according to the fourth embodiment of the invention is characterized as follows. The memory includes the first electrode, the separating medium, the resistance changing layer and the second electrode. The first electrode includes the mounting face. The separating medium includes the first and second faces opposite to each other, and forms the through hole extending from the first face to the second face. The first face of the separating medium is in contact with the mounting face of the first electrode. A part of the mounting face of the first electrode is not covered by the separating medium. The separating medium has the first dielectric. The resistance changing layer is arranged on the part of the mounting face of the first electrode not covered by the separating medium, as well as the inner face and the second face of the separating medium. The resistance changing layer has the second dielectric. The second dielectric is larger than that of the first dielectric by 2 or less (i.e. the difference is as small as 2 or below). Alternatively, the second dielectric is even smaller than that of the first dielectric. The second electrode is arranged on the resistance changing layer.

In the above arrangements, when the volume of the memory reduces, the forming voltage will not become higher. Thus, the advantage such as higher stability of the forming voltage is achieved. As compared with the conventional resistive random access memory where the forming voltage becomes higher and higher due to the reduction in size of the through hole, the memories according to the first to fourth embodiments of the invention are able to avoid adverse effects of the memories when said memories are integrated into integrated circuits.

Furthermore, by the inclusion of the first and third dielectrics of the separating medium, the first and third dielectrics have different dielectric constants and distribution regions. In this regard, both the first and third dielectrics adjoin the resistance changing layer, and the first dielectric is more adjacent to the first electrode. In addition, the region of the first dielectric may have the same thickness as the resistance changing layer for easy adjustment of dielectric constant. Also, the second electrode may extend upwards to form the protruding portion located out of the recess portion of the resistance changing layer for simplification of production procedure and cost reduction, Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A resistive random access memory, comprising:
   a first electrode having a mounting face;
   a separating medium having a first face in contact with the mounting face of the first electrode, a second face opposite to the first face, and an inner face extending between the first and second faces, wherein the separating medium forms a through hole extending from the first face to the second face, wherein a part of the mounting face of the first electrode is not covered by the separating medium, and wherein the separating medium has a first dielectric;
   a resistance changing layer extending along the part of the mounting face of the first electrode as well as the inner face and the second face of the separating medium, wherein the resistance changing layer has a second dielectric having a dielectric constant smaller than a dielectric constant of the first dielectric; and
   a second electrode arranged on the resistance changing layer,
   wherein the separating medium further comprises a third dielectric having a dielectric constant different from the dielectric constant of the first dielectric, wherein the first and third dielectrics have different distribution regions, and wherein both the first and third dielectrics adjoin the resistance changing layer.

2. The resistive random access memory as claimed in claim 1, wherein the first dielectric is adjacent to the first electrode than the third dielectric is.

3. The resistive random access memory as claimed in claim 1, wherein the resistance changing layer forms a recess portion located in the through hole.

4. The resistive random access memory as claimed in claim 3, wherein the second electrode extends from an interior to an exterior of the recess portion and forms a hole, and wherein the hole is located in the interior of the recess portion.

5. The resistive random access memory as claimed in claim 3, wherein the interior of the recess portion is completely filled by the second electrode, wherein the second electrode forms a protruding portion, and wherein the protruding portion is located outside of the recess portion.

* * * * *